United States Patent
Hogle et al.

(10) Patent No.: US 8,896,090 B2
(45) Date of Patent: Nov. 25, 2014

(54) ELECTRICAL FUSES AND METHODS OF MAKING ELECTRICAL FUSES

(71) Applicant: International Business Machines Corporation, Armonk, NY (US)

(72) Inventors: Nicholas R. Hogle, Franklin, VT (US); Baozhen Li, South Burlington, VT (US); Keith Kwong Hon Wong, Wappingers Falls, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/774,373

(22) Filed: Feb. 22, 2013

(65) Prior Publication Data

US 2014/0239439 A1   Aug. 28, 2014

(51) Int. Cl.
*H01L 29/00* (2006.01)
*H01L 23/525* (2006.01)

(52) U.S. Cl.
CPC .................... *H01L 23/5256* (2013.01)
USPC ........... 257/529; 257/209; 257/665; 438/132; 438/281

(58) Field of Classification Search
USPC ........... 257/209, 529, 665; 438/132, 215, 281
See application file for complete search history.

(56) References Cited

U.S. PATENT DOCUMENTS

| | | | |
|---|---|---|---|
| 6,100,194 A * | 8/2000 | Chan et al. .................... | 438/686 |
| 6,184,137 B1 | 2/2001 | Ding et al. | |
| 6,242,789 B1 | 6/2001 | Weber et al. | |
| 7,649,240 B2 | 1/2010 | Kim et al. | |
| 7,825,490 B2 | 11/2010 | Kim et al. | |
| 8,053,862 B2 | 11/2011 | Greco | |
| 8,133,767 B2 | 3/2012 | Yang et al. | |
| 8,193,087 B2 * | 6/2012 | Shih et al. .................... | 438/634 |
| 8,232,190 B2 | 7/2012 | Bernstein et al. | |
| 2008/0012138 A1 * | 1/2008 | Wang et al. .................... | 257/758 |
| 2010/0090751 A1 | 4/2010 | Cheng et al. | |
| 2012/0168942 A1 * | 7/2012 | Gan et al. .................... | 257/738 |
| 2013/0309863 A1 * | 11/2013 | Lin et al. .................... | 438/653 |

OTHER PUBLICATIONS

Takaoka, H. et al.; A Novel Via-fuse Technology Featuring Highly Stable Blow Operation with Large On-off Ratio for 32nm Node and Beyond; Electron Devices Meeting, 2007. IEDM 2007. IEEE International Digital Object Identifier: 10.1109/IEDM.2007.4418858 Publication Year: 2007, pp. 43-46.

* cited by examiner

*Primary Examiner* — Phuc Dang
(74) *Attorney, Agent, or Firm* — Schmeiser, Olsen & Watts; David Cain

(57) ABSTRACT

A fuse, a method of making the fuse and a circuit containing the fuse. The fuse includes an electrically conductive and conformal liner on sidewalls and the bottom of a trench; a copper layer on the conformal liner, a first thickness of the copper layer over the bottom of the trench in a lower portion of the trench greater than a second thickness of the copper layer over the sidewalls of the trench in an abutting upper portion of the trench; and a dielectric material on the copper layer in the trench, the dielectric material filling remaining space in the upper portion of said trench.

28 Claims, 7 Drawing Sheets

ELECTRICAL FUSES AND METHODS OF MAKING ELECTRICAL FUSES

TECHNICAL FIELD

The present invention relates to the field of integrated circuits; more specifically, it relates to electrical fuses and methods of making electrical fuses.

BACKGROUND

Fuses are among the simplest and most compact mechanism for programming integrated circuit functions. Among the types of fuses currently used there are two main types, transistor based fuses and metal wire based fuses. As dimensions of fuses have decreased, transistor based fuses have become increasingly inoperable due to the inherent robustness of the gate material which is the fusible portion of transistor based fuses and the reliability of programming metal wire fuses has been negatively effected by the dimensional control of the lithographic processes used to fabricate metal wire fuses. Accordingly, there exists a need in the art to mitigate the deficiencies and limitations described hereinabove.

BRIEF SUMMARY

A first aspect of the present invention is a structure, comprising: a trench formed in a dielectric layer; and a fuse comprising: an electrically conductive and conformal liner on sidewalls and the bottom of the trench; a copper layer on the conformal liner, a first thickness of the copper layer over the bottom of the trench in a lower portion of the trench greater than a second thickness of the copper layer over the sidewalls of the trench in an abutting upper portion of the trench; and a dielectric material on the copper layer in the trench, the dielectric material filling remaining space in the upper portion of said trench.

A second aspect of the present invention is a method, comprising: forming a trench formed in a dielectric layer; and forming a fuse in the dielectric layer comprising: an electrically conductive and conformal liner on sidewalls and the bottom of the trench; a copper layer on the conformal liner, a first thickness of the copper layer over the bottom of the trench in a lower portion of the trench greater than a second thickness of the copper layer over the sidewalls of the trench in an abutting upper portion of the trench; and a dielectric material on the copper layer in the trench, the dielectric material filling remaining space in the upper portion of said trench.

A third aspect of the present invention is a fuse circuit, comprising: a fuse switchably connected between a positive voltage source and ground, the fuse also switchably connected between the positive voltage source and a compare circuit configured to determine the voltage drop across the fuse; and the fuse comprising: a trench formed in a dielectric layer; an electrically conductive and conformal liner on sidewalls and the bottom of the trench; a copper layer on the conformal liner, a first thickness of the copper layer over the bottom of the trench in a lower portion of the trench greater than a second thickness of the copper layer over the sidewalls of the trench in an abutting upper portion of the trench; and a dielectric material on the copper layer in the trench, the dielectric material filling remaining space in the upper portion of said trench.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

Figure 1A:
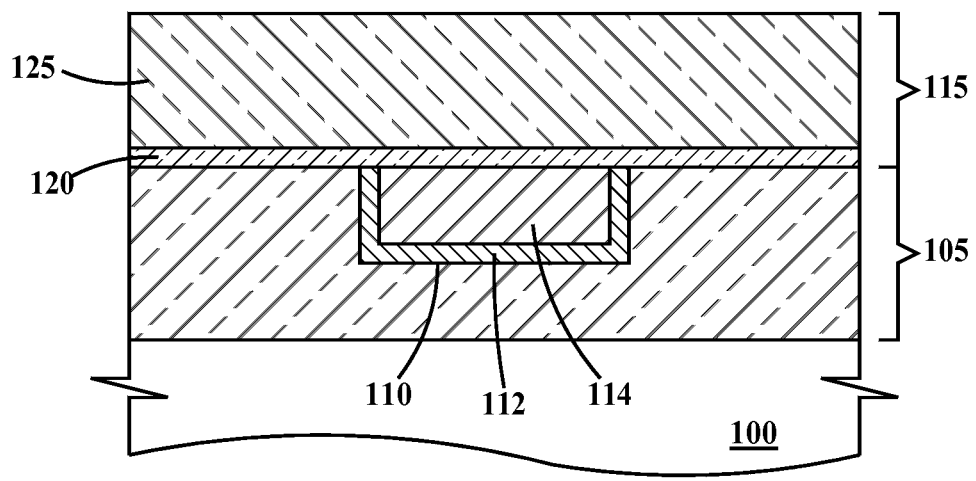
FIGS. 1A through 1H illustrate fabrication of electrical fuses according to embodiments of the present invention.

Electrical fuses (e-fuses) are devices comprising an electrically conductive fusible portion that physically alter the structure (e.g., melt, vaporize or undergo electromigration) which changes (e.g., increase) the resistance of fusible portion when current is forced through the fusible portion. The e-fuses according to the embodiments of the present invention comprise an ultra-thin copper layer on the sidewalls of a trench and a thicker copper layer on the bottom of the trench with the ultra-thin copper layer acting as the fusible portion of the e-fuse. The e-fuses according to embodiments of the present invention have a higher resistance after programming (also called fuse-blow) than before programming.

A damascene process is one in which wire trenches or via openings are formed in a dielectric layer, an electrical conductor of sufficient thickness to fill the trenches is formed in the trenches and on a top surface of the dielectric. A chemical-mechanical-polish (CMP) process is performed to remove excess conductor from the surface of the dielectric layer and make the surface of the conductor co-planar with the top surface of the dielectric layer to form damascene wires (or damascene vias). When only a trench and a wire (or a via opening and a via) is formed the process is called single-damascene.

A via first dual-damascene process is one in which via openings are formed through the entire thickness of the dielectric layer followed by formation of trenches part of the way through the dielectric layer in any given cross-sectional view. A trench first dual-damascene process is one in which trenches are formed part way through the thickness of a dielectric layer followed by formation of vias inside the trenches the rest of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is formed on a top surface of the dielectric layer and a CMP process is performed to make the surface of the conductor in the trench co-planar with the top surface of the dielectric layer to form dual-damascene wires having integral vias.

A conformal layer (or liner) is defined as a layer that follows the contours of the surface the layer is formed on. In one example, a conformal layer has a thickness that is relatively the same everywhere along the interface when measured perpendicular to the surface the conformal layer is formed on. A conformal layer may exhibit thickness variations along edges or steps of the surface but yet be considered a conformal layer. Conformal layers may be deposited by thin-film deposition methods, such as plating, chemical vapor deposition or atomic layer deposition.

When the term "damascene wire" is used hereafter to mean a single-damascene wire or a dual-damascene wire unless the term single-damascene wire or a dual-damascene wire is explicitly stated.

FIGS. 1A through 1H illustrate fabrication of electrical fuses according to embodiments of the present invention. In FIG. 1A, formed on a semiconductor (e.g., silicon) substrate 100 is a dielectric layer 105 and formed in dielectric layer 105 is a damascene wire 110. Wire 110 comprises an optional conformal electrically conductive liner 112 and an electrically conductive core conductor 114. Formed on a top surface of dielectric layer 105 is a dielectric layer 115 comprising an optional dielectric etch stop layer 120 and a dielectric layer 125. In one example, dielectric layers 105 and 125 may comprise materials independently selected from the group consisting of silicon dioxide ($SiO_2$), tetraethyl orthosilicate glass (TEOS), fluorinated $SiO_2$ (FSG), FTEOS, a low K (dielectric constant) material, hydrogen silsesquioxane polymer (HSQ), methyl silsesquioxane polymer (MSQ), organosilicate glass (methyl doped silica or $SiO_x(CH_3)_y$, or $SiC_xO_yH_y$ or SiCOH), and polyphenylene oligomer. A low K dielectric material has a relative permittivity of about 3.0 or less. In one example, dielectric layer 120 may comprise a material selected from the group consisting of silicon nitride ($Si_3N_4$), silicon carbide (SiC), silicon oxy nitride (SiON), silicon oxy carbide (SiOC), organosilicate glass (SiCOH), plasma-enhanced silicon nitride ($PSiN_x$) or NBLok (SiC(N,H)). In one example, dielectric layer 120 is a copper diffusion barrier. In one example, liner 112 comprises a layer of tantalum nitride (TaN) closest to dielectric layer and a layer of Ta on the TaN layer and core conductor 112 is copper. In one example, liner 110 comprises a layer of titanium nitride (TiN) closest to dielectric layer and a layer of Ti on the TiN layer and core conductor 114 is copper. In one example, liner 112 comprises a layer of tungsten nitride (WN) and core conductor 114 is W.

Figure 1B:
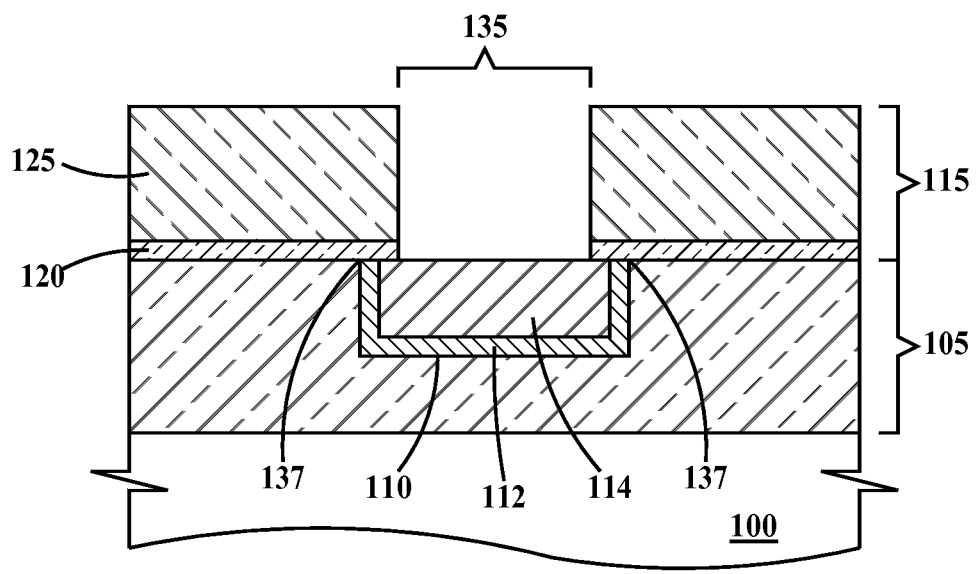

In FIG. 1B, a trench 135 is formed through dielectric layer 115 and wire 110 is exposed in the bottom of trench 135. In one example, trench 135 is formed by photolithographically forming a patterned photoresist layer on dielectric layer 105, performing a reactive ion etch to remove dielectric layer 115 where dielectric layer is not protected by the patterned photoresist layer and then removing the patterned photoresist layer. It is preferred that dielectric layer 115 extends over core conductor 114 along the entire perimeter 137 of wire 114.

Figure 1C:
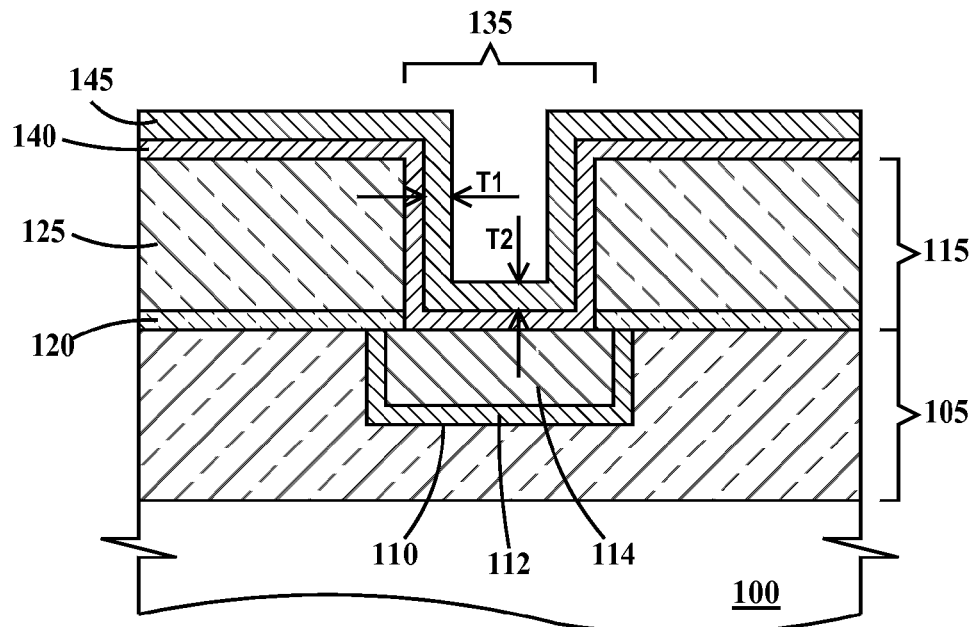

In FIG. 1C, a conformal and electrically conductive liner layer 140 is formed on the sidewalls and bottom of trench 135 and on the top surface of dielectric layer 115. A conformal copper layer 145 is formed on the top surface of liner layer 140. Liner layer 140 does not fill trench 135, nor does copper layer 145. In one example, liner layer 140 comprises a first layer of TaN, TiN, W(N), or ruthenium tantalum nitride (RuTa(N)) on the sidewalls and bottom of trench 135 and a second layer of cobalt (Co), Ru, iridium (Ir), rhodium (Rh), platinum (Pt) or lead tantalum (PbTa) on the optional first layer. In one example, liner layer 140 comprises a single layer of Co, Ru, Ir, Rh, Pt or Ta. In one example, when liner layer 140 comprises a first layer and a second layer, the first layer is a copper diffusion barrier. In one example, liner layer 140 has a thickness between about 1 nm and about 10 nm. In one example, liner layer 140 comprises a layer of TaN (e.g., about 6 nm thick) lining the sidewalls and bottom of trench 135 and a layer of Ru about 3 nm thick on the TaN layer. Liner layer 145 has a thickness T1 over the sidewalls of trench 135 and a thickness T2 over the bottom of trench 135. In one example, T1 is about equal to T2 and T1. In one example, T1 and T2 are between about 5 nm and about 20 nm. In one example, T1 is about equal to T2 and T1 and T1 and T2 are between about 5 nm and about 20 nm. Liner layer 140 and copper layer 145 may be independently formed using chemical-vapor-deposition (CVD) or physical-vapor-deposition (PVD). Copper layer 145 may also be formed by evaporative deposition.

Figure 1D:
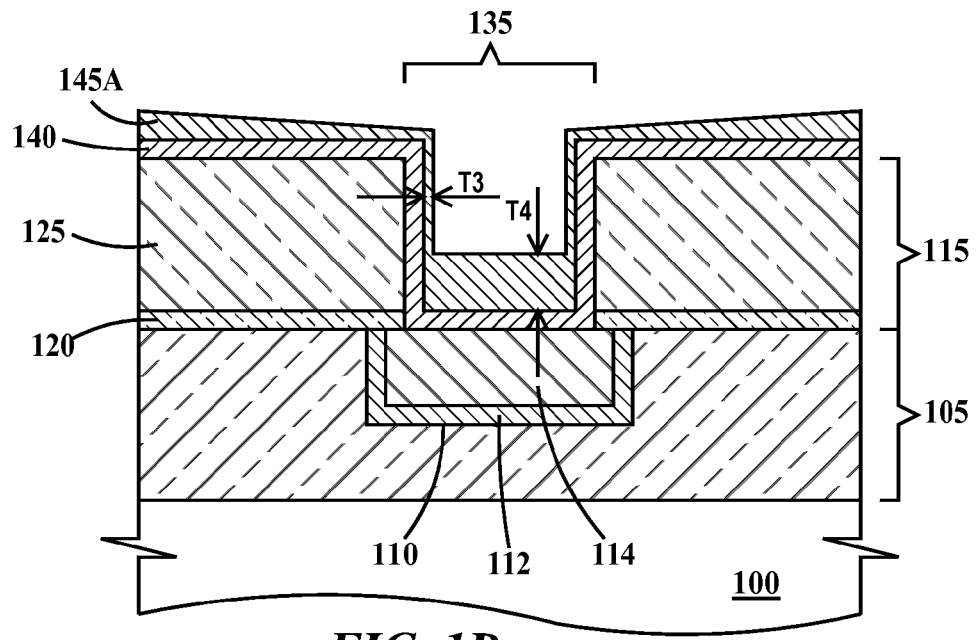

In FIG. 1D, a low temperature anneal (e.g., less than about 400° C.) in an inert (e.g., nitrogen ($N_2$)) or reducing (e.g., hydrogen ($H_2$) or a $H_2/N_2$ mixture) atmosphere. The annealing atmosphere contains a very low oxygen ($O_2$) content (e.g., less than 1 ppm). In one example, the anneal temperature is between about 200° C. and about 350° C. In one example, the anneal temperature is no greater than about 250° C. In one example, the anneal temperature is about 250° C. In one example, the anneal time is about 30 minutes. The annealing process may be immediately preceded by a $H_2$ cleaning process. It is critical that the anneal temperature should not exceed about 400° C. in order to avoid damage to integrated circuit devices fabricated in substrate 100 prior to the annealing. The high-temperature anneal causes copper layer 145 (see FIG. 1C) to reflow to form a copper layer 145A. Copper layer 145A has a thickness T3 over the sidewalls of trench 135 and a thickness T4 over the bottom of trench 135. The time and temperature of the anneal control the thickness T3. T3 is less than T1, T2 is greater than T2 and T3 is less than T4. In one example T3 is between about 1 nm and about 5 nm. After the anneal, liner 140 and copper layer 145A fill a lower portion of trench 135 but liner 140 and copper layer 145A do not fill an abutting upper portion of trench 135; the top surface of copper layer 145A is the bottom of the trench defining the interface between the lower and upper portions.

Figure 1E:
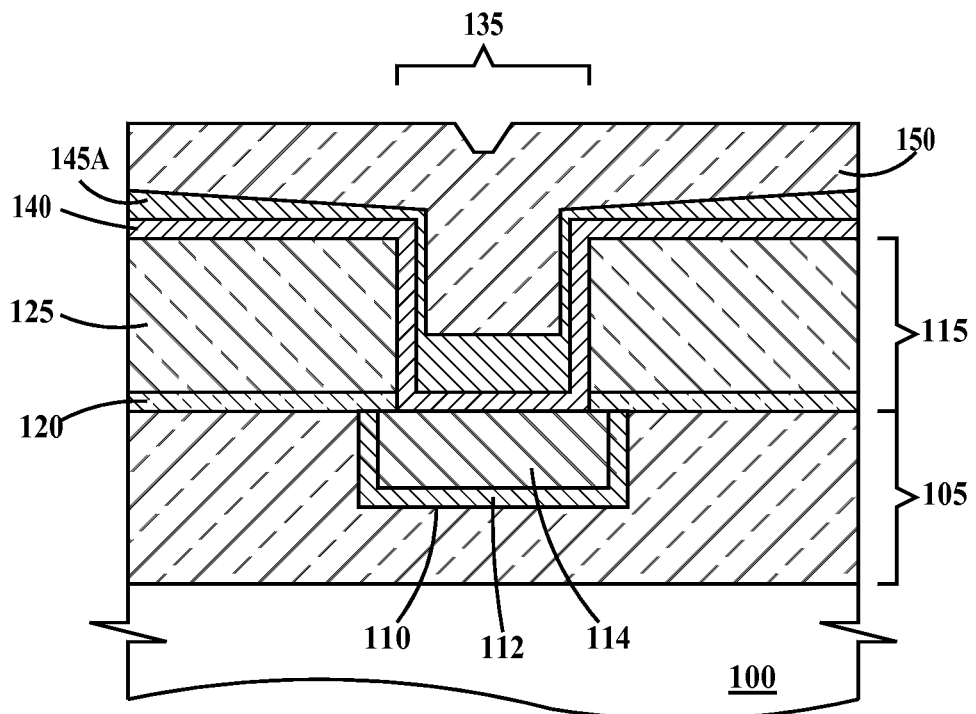

In FIG. 1E, a dielectric layer 150 is formed on copper layer 145A. Dielectric layer completely fills remaining space in trench 135. In one example, dielectric layer 150 may comprise materials selected from the group consisting of silicon dioxide ($SiO_2$), TEOS, FSG, FTEOS, a low K (dielectric constant) material, HSQ, MSQ, organosilicate glass (methyl doped silica or $SiO_x(CH_3)_y$, or $SiC_xO_yH_y$ or SiCOH), and polyphenylene oligomer.

Figure 1F:
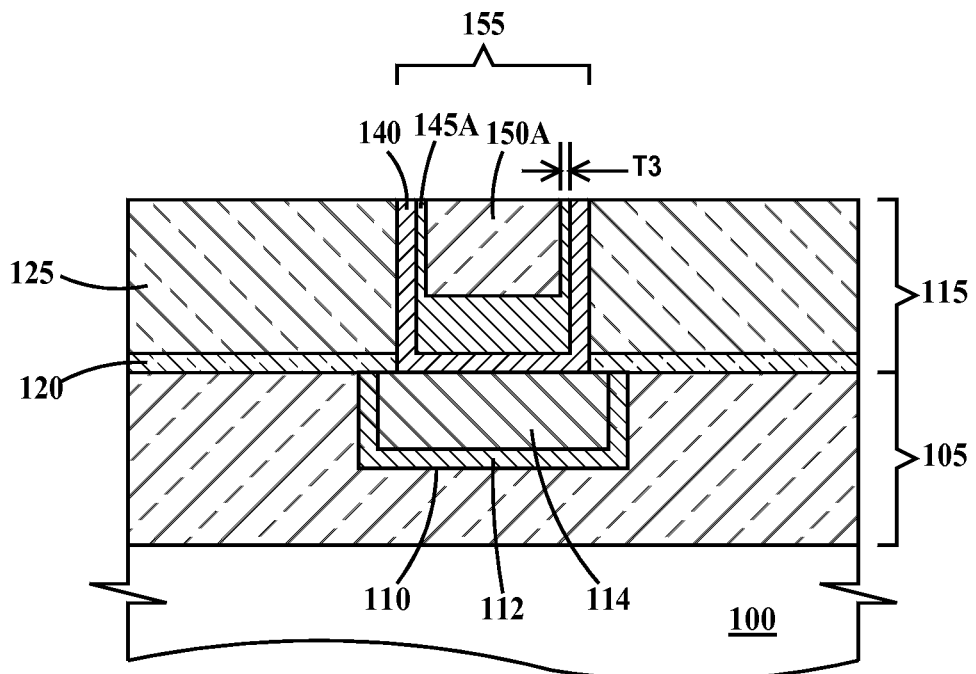

In FIG. 1F, a CMP has been performed to remove excess dielectric layer 150, copper layer 145A and liner layer 140 to form a fuse 155 comprising optional liner layer 140, copper layer 145A and dielectric fill 150A (derived from dielectric layer 150 of FIG. 1E). The top surface of fuse 155 is coplanar with the top surface of dielectric layer 115.

The thickness T3 controls the electrical properties of the fuse. Fuse is programmed (e.g., "blown") by passing a current through the thin sidewall portions so melting, vaporization or electromigration (or combinations thereof) of the thin sidewall portion occurs resulting in an increase of resistance of the thin sidewall portion. It is a critical feature of fuse 155 that the thickness T3 of the portion of copper layer 145A between dielectric fill 150A and dielectric layer 115 be less than the thickness T1 of the as formed copper layer 145 (see FIG. 1C) in order to minimize the amount of programming current required compared to the amount of current the as deposited thickness T1 would require. It is a critical feature of fuse 155 that the greater thickness T4 (see FIG. 1D) of the lower portion of be greater than the thickness T3 and T2 (see FIG. 1C) in order to protect structures underlying fuse 155 from damage.

Because the thickness T3 is controlled by the conditions (e.g., temperature and time) of anneal process it is not limited by lithographic dimensional control or inherent robustness of the fusible material.

Figure 1G:
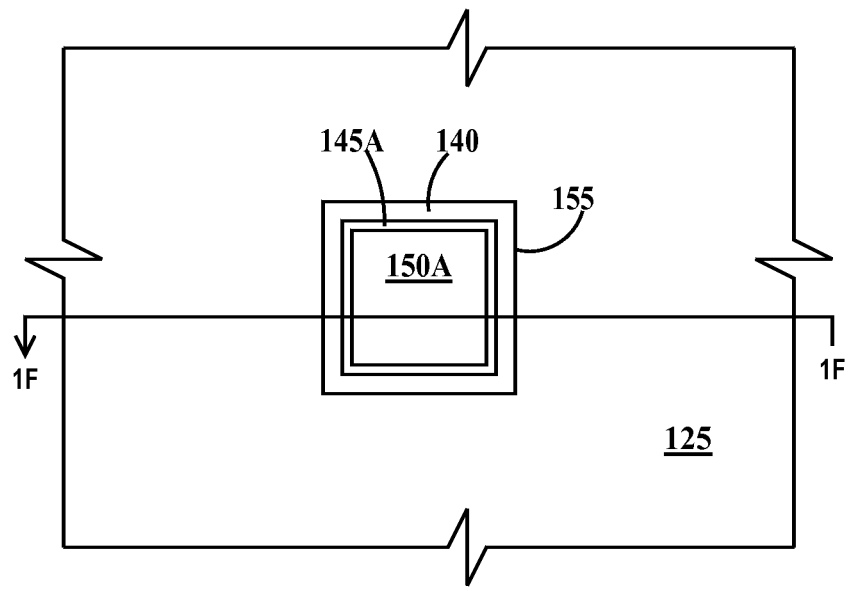

FIG. 1G is a top view of FIG. 1F. FIG. 1F is a cross-section through line 1F-1F of FIG. 1G. In FIG. 1G, fuse 155 includes optional liner layer 140, copper layer 145A and dielectric fill 150A. While fuse 155 is illustrated as square, it may be rectangular "L-shaped" or serpentine in shape.

Figure 1H:
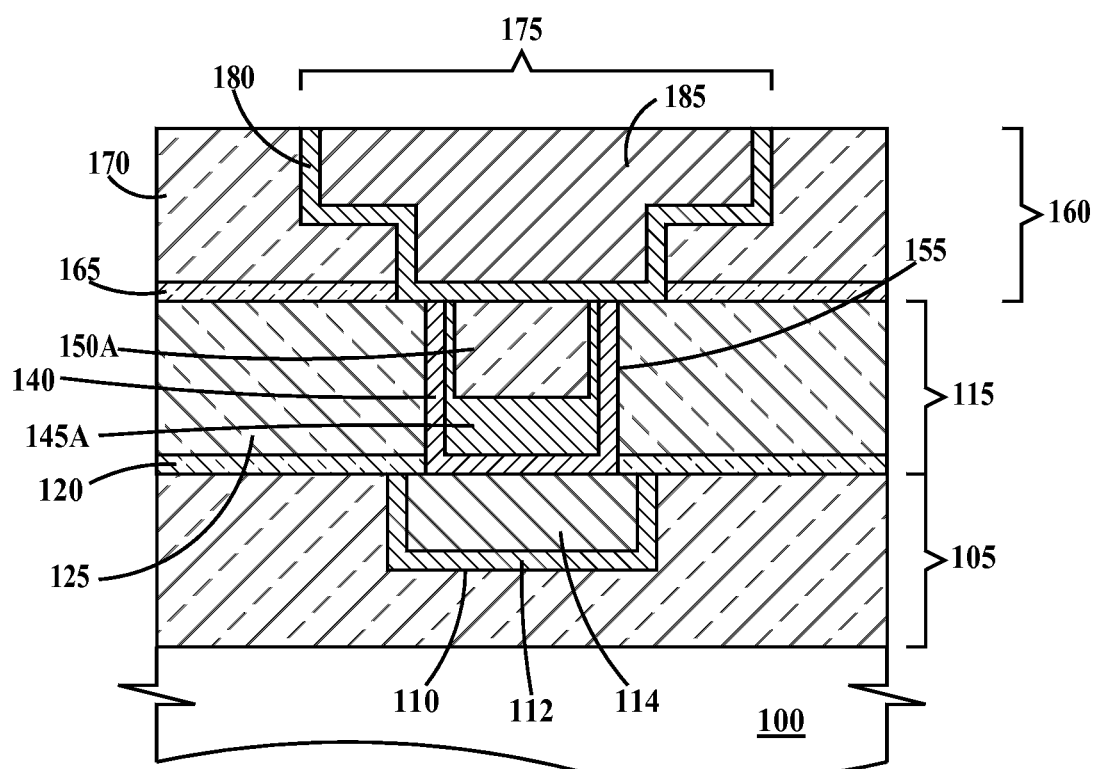

In FIG. 1H, an interlevel dielectric layer 160 is formed on dielectric layer 115. Interlevel dielectric layer 160 includes an optional etch stop/copper diffusion barrier dielectric layer 165 and a dielectric layer 170 on dielectric layer 165. A damascene wire 175 is formed in interlevel dielectric layer 160 (a dual-damascene wire is illustrated). Wire 175 comprises an optional conformal electrically conductive liner 180 and an electrically conductive core conductor 185. Materials for dielectric layer 165 are the same as for dielectric layer 120 described supra. Materials for dielectric layer 170 are the same as for dielectric layer 125 described supra. Materials for liner 180 are the same as for liner 112 described supra. Materials for core conductor 185 are the same as for core conductor 114 described supra. Fuse 155 electrically connects wire 110 to wire 175, which wires allow connection of fuse 155 into a circuit such as that of FIG. 7 described infra.

Wire 110 may be replaced by a contact that extends to a source/drain of a field effect transistor (FET) in substrate 100 or a gate of an FET formed in dielectric layer 105.

Figure 2:
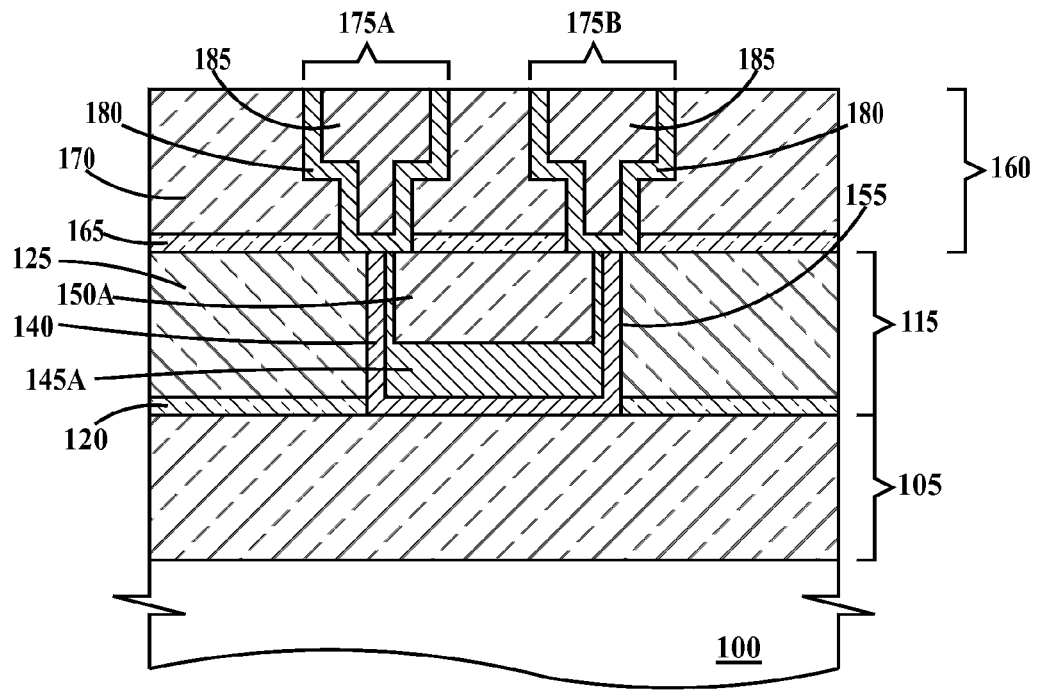
FIG. 2 illustrates an alternative method of contacting electrical fuses according to embodiments of the present invention.

FIG. 2 illustrates an alternative method of contacting electrical fuses according to embodiments of the present invention. FIG. 2 is similar to FIG. 1H except there is no wire 110 (see FIG. 1H) and there are two damascene wires 175A and 175B (dual-damascene wires are illustrated) contacting different regions of fuse 155. Thus, fuse 155 electrically connects wire 175A to wire 175B, which wires allow connection of fuse 155 into a circuit such as that of FIG. 7 described infra.

Figure 3:
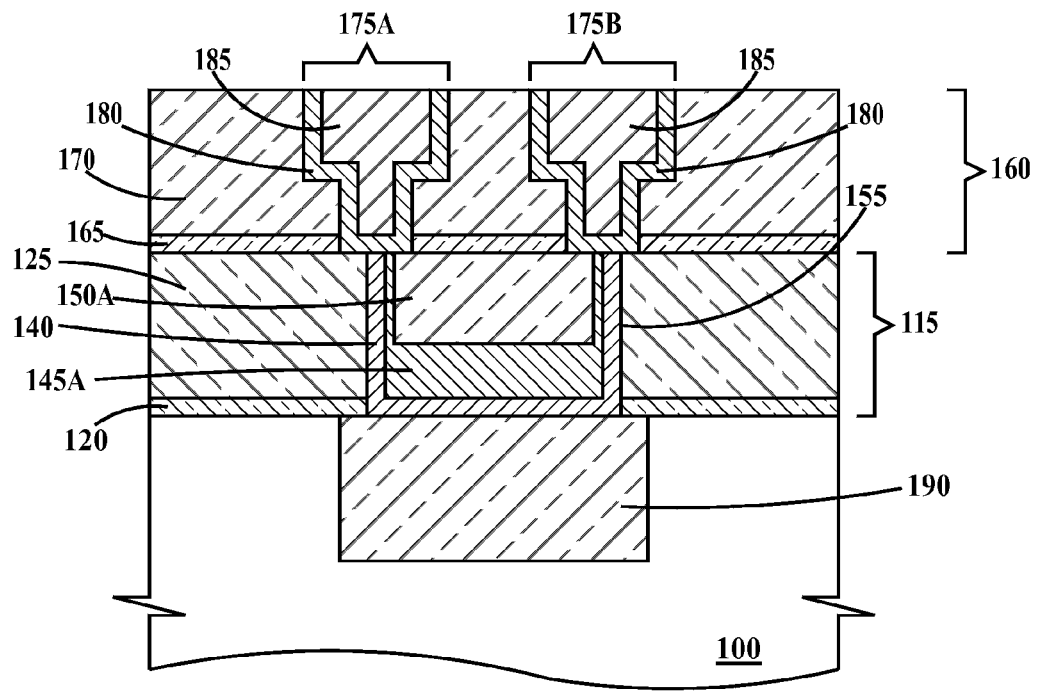
FIG. 3 illustrates an alternative location for electrical fuses according to embodiments of the present invention.

FIG. 3 illustrates an alternative location for electrical fuses according to embodiments of the present invention. FIG. 3 is similar to FIG. 1H except there is no wire 110 (see FIG. 1H), there are two wires 175A and 175B (instead of single wire 175 of FIG. 1H) contacting different regions of fuse 155 and fuse 155 is isolated from substrate 100 by trench isolation 190 formed in substrate 190 instead of dielectric layer 105 of FIG. 1H). Thus, fuse 155 electrically connects wire 175A to wire 175B, which wires allow connection of fuse 155 into a circuit such as that of FIG. 7 described infra.

Figure 4:
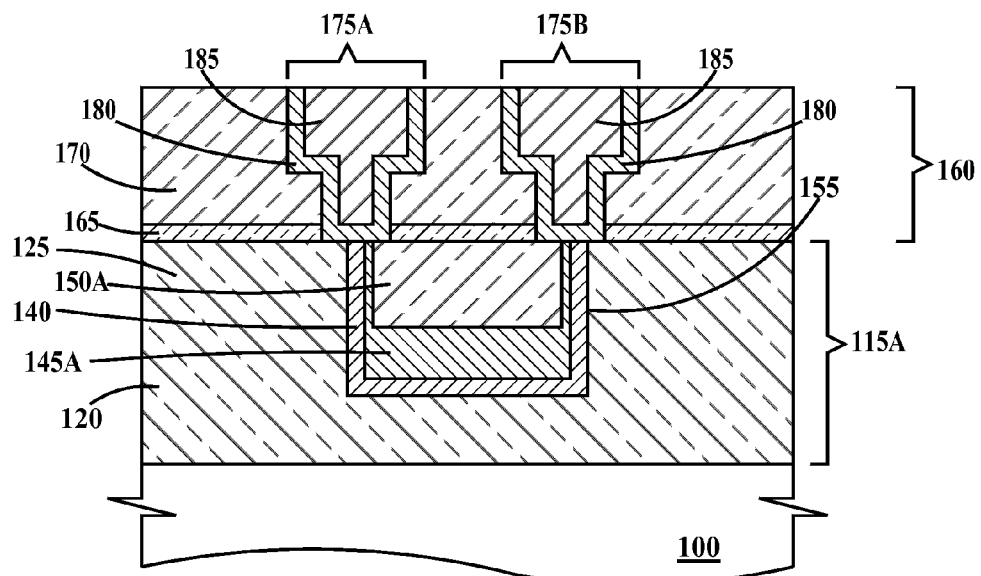
FIG. 4 illustrates an alternative location for electrical fuses according to embodiments of the present invention.

FIG. 4 illustrates an alternative location for electrical fuses according to embodiments of the present invention. FIG. 4 is similar to FIG. 2 except fuse 155 is formed in a dielectric layer 115A and does not extend through dielectric layer 115A, so dielectric layer 115A itself isolates fuse 115A from substrate 100. Materials for dielectric layer 115A are the same as for dielectric layer 115 described supra.

Figure 5:
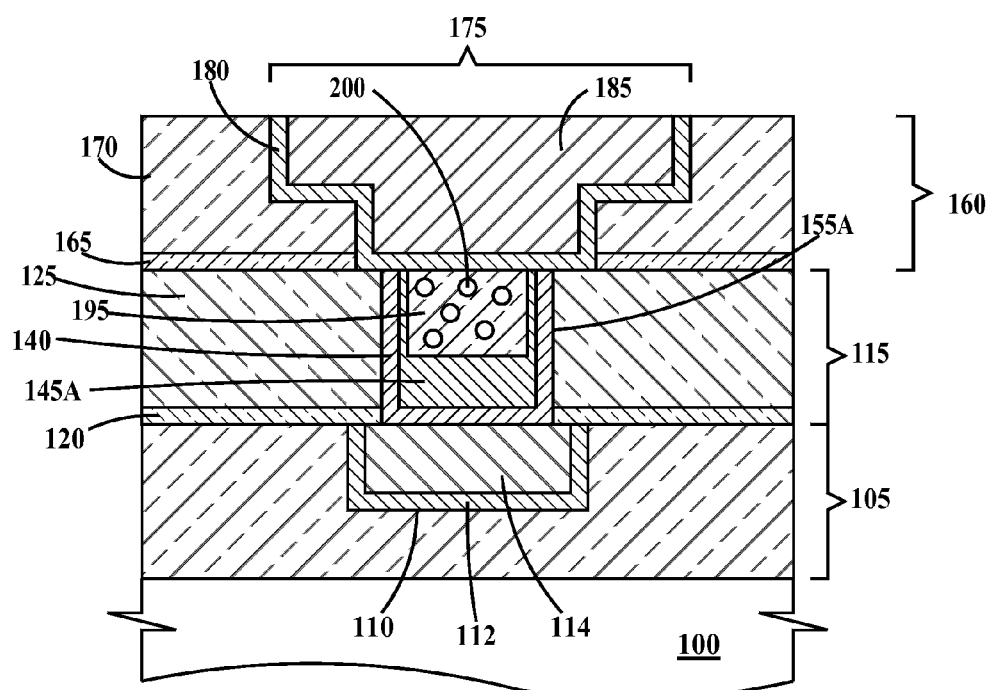
FIG. 5 illustrates a modified electrical fuse structure according to embodiments of the present invention.

FIG. 5 illustrates a modified electrical fuse structure according to embodiments of the present invention. FIG. 5 is similar to FIG. 1H except dielectric fill 150A of fuse 155 of FIG. 1H is replaced with dielectric fill 195 in a fuse 155A. Dielectric fill 195 includes voids 200. Voids 200 allow adsorption of shock when fuse 155A is programmed. In one example, dielectric layer 195 is a porous silsesquioxane resin. It should be understood that dielectric fill 195 may replace dielectric fill 150A in FIGS. 2, 3 and 4.

Figure 6:
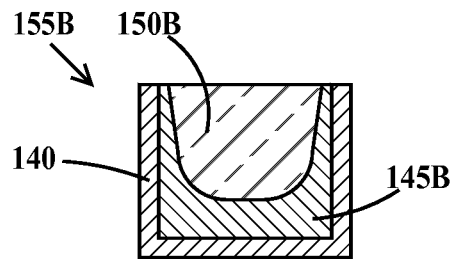
FIG. 6 illustrates an alternative structure of the fusible link portion of electrical fuses according to embodiments of the present invention.

FIG. 6 illustrates an alternative structure of electrical fuses according to embodiments of the present invention. In FIG. 6 a fuse 155B is similar to fuse 155 of FIG. 1F except copper layer 145B replaces copper layer 145A of FIG. 1F and dielectric fill 150B replaces dielectric fill 150A of FIG. 1F. In FIG. 6, copper layer 145B tapers in thickness instead of being uniformly thick in the upper portion of fuse 155B and copper layer 145B is concave instead of being flat in the lower portion of fuse 155B. The thickness of copper layer 145B in the bottom of fuse 155B is greater than the thickness of copper layer 145B in the upper portion of fuse 155B.

Figure 7:
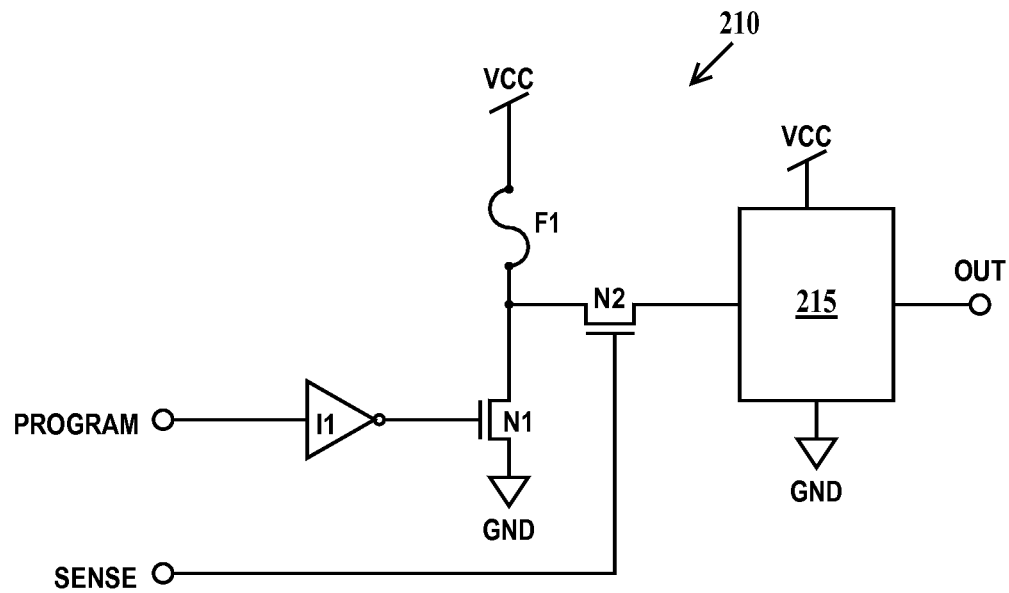
FIG. 7 is an exemplary fuse program/sense circuit.

FIG. 7 is an exemplary fuse program/sense circuit. In FIG. 7, a fuse circuit 210 includes an inverter I1, a fuse F1, a first NFET N1, a second NFET N2 and a fuse state sensor 215. Fuse F1 may take the form of any of the fuse embodiments described supra. The input of inverter I1 is connected to a signal PROGRAM and the output of inverter I1 is connected to the gate of NFET N1. A first terminal of fuse F1 is connected to VCC (e.g., a positive voltage greater than zero) and a second terminal of fuse F1 is connected to the drains of NFETS N2 and N1. The source of NFET N2 is connected to GND (e.g., zero volts) and the source of NFET N2 is connected to an input of fuse state sensor 215. A signal SENSE is connected to the gate of NFET N2. Fuse state sensor 215 is connected to VCC and GND and the output of fuse state sensor 215 is a signal OUT. When PROGRAM is high (logical 1) and SENSE is low (logical zero) NFET N1 is on and NFET N2 is off so fuse F1 is connected between VCC and GND and "blows" (e.g., its resistance increases). When PROGRAM is low and SENSE is high NFET N1 is off and NFET N2 is on so fuse F1 is connected between VCC and fuse sense circuit 215. In one example, fuse state sensor 215 compares the voltage drop between VCC and GRD across fuse F1 and a reference voltage drop between VCC and GND using a differential amplifier. When there is more current drop across fuse F1 than the reference, the OUT signal indicates a "blown" fuse. It should be understood, that there are many other ways to implement a fuse blow/sense circuit.

Thus the embodiments of the present invention provide an electrical fuse that is not limited by lithographic dimensional control or inherent robustness of the fusible material.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure, comprising:
    a trench formed in a dielectric layer; and
    a fuse comprising:
        an electrically conductive and conformal liner on sidewalls and the bottom of said trench;
        a copper layer on said conformal liner, a first thickness of said copper layer over said bottom of said trench in a lower portion of said trench greater than a second thickness of said copper layer over said sidewalls of said trench in an abutting upper portion of said trench; and
        a dielectric material on said copper layer in said trench, said dielectric material only in said trench and filling remaining space in said upper portion of said trench.

2. The structure of claim 1, wherein a top surface of said fuse comprises exposed edges of said conformal liner and said copper layer proximate to said sidewall of said trench and a top surface of said dielectric material is coplanar with a top surface of said dielectric layer.

3. The structure of claim 1, wherein said fuse does not extend completely through said dielectric layer.

4. The structure of claim 1, where in said dielectric layer is formed over a semiconductor substrate.

5. The structure of claim 1, further including:
a lower damascene wire formed in a lower dielectric layer, said lower dielectric layer between a semiconductor substrate and said dielectric layer and abutting a bottom surface of said dielectric layer, a bottom surface of said fuse abutting a top surface of said lower damascene wire; and
an upper damascene wire formed in an upper dielectric layer, said upper dielectric layer abutting a top surface of said dielectric layer, a top surface of said fuse abutting a bottom surface of said upper damascene wire.

6. The structure of claim 1, further including:
a lower dielectric layer between a semiconductor substrate and said dielectric layer and abutting a bottom surface of said dielectric layer, a bottom surface of said fuse abutting a top surface of said lower dielectric layer;
a first upper damascene wire formed in an upper dielectric layer, said upper dielectric layer abutting a top surface of said dielectric layer, a first region of a top surface of said fuse abutting a bottom surface of said first upper damascene wire; and
a second upper damascene wire formed in said upper dielectric layer, a second and different region of said top surface of said fuse abutting a bottom surface of said second upper damascene wire.

7. The structure of claim 1, further including:
an island of trench isolation formed in a semiconductor substrate, top surfaces of said trench isolation and said semiconductor substrate coplanar and abutting a lower surface of said dielectric layer, a bottom surface of said fuse abutting a top surface of said trench isolation;
a first upper damascene wire formed in an upper dielectric layer, said upper dielectric layer abutting a top surface of said dielectric layer, a first region of a top surface of said fuse abutting a bottom surface of said first upper damascene wire; and
a second upper damascene wire formed in said upper dielectric layer, a second and different region of said top surface of said fuse abutting a bottom surface of said second upper damascene wire.

8. The structure of claim 1, further including:
a first upper damascene wire formed in an upper dielectric layer, said upper dielectric layer abutting a top surface of said dielectric layer, a first region of a top surface of said fuse abutting a bottom surface of said first upper damascene wire;
a second upper damascene wire formed in said upper dielectric layer, a second and different region of said top surface of said fuse abutting a bottom surface of said second upper damascene wire; and
wherein a top surface of said fuse is coplanar with said top surface of said dielectric layer and said fuse does not extend completely through said dielectric layer.

9. The structure of claim 1, wherein said liner comprises a layer of Co, Ru, Ir, Rh, Pt or Ta.

10. The structure of claim 1, wherein said conformal liner comprises a first layer of TaN, TiN, W(N), or RuTa(N) lining the sidewalls and bottom of said trench and a second layer of Co, Ru, Ir, Rh, Pt or Ta on said first layer.

11. The structure of claim 1, wherein said dielectric material has a relative permittivity of about 3.0 or less or is a porous dielectric material.

12. The structure of claim 1, wherein said second thickness is between about 1 nm and about 5 nm.

13. A method, comprising:
forming a trench formed in a dielectric layer;
forming a fuse in said dielectric layer comprising:
forming an electrically conductive and conformal liner on sidewalls and the bottom of said trench;
forming a copper layer on said conformal liner, after forming said copper layer reflowing said copper layer to form a reflowed copper layer, a first thickness of said reflowed copper layer over said bottom of said trench in a lower portion of said trench greater than a second thickness of said reflowed copper layer over said sidewalls of said trench in an abutting upper portion of said trench; and
forming a dielectric material on said reflowed copper layer in said trench, said dielectric material filling remaining space in said upper portion of said trench.

14. The method of claim 13, wherein a top surface of said fuse comprises exposed edges of said conformal liner and said copper layer proximate to said sidewall of said trench and a top surface of said dielectric material is coplanar with a top surface of said dielectric layer.

15. The method of claim 13, wherein said fuse does not extend completely through said dielectric layer.

16. The method of claim 13, where in said dielectric layer is formed over a semiconductor substrate.

17. The method of claim 13, further including:
forming a lower damascene wire in a lower dielectric layer, said lower dielectric layer between a semiconductor substrate and said dielectric layer and abutting a bottom surface of said dielectric layer, a bottom surface of said fuse abutting a top surface of said lower damascene wire; and
forming an upper damascene wire in an upper dielectric layer, said upper dielectric layer abutting a top surface of said dielectric layer, a top surface of said fuse abutting a bottom surface of said upper damascene wire.

18. The method of claim 13, further including:
forming a lower dielectric layer between a semiconductor substrate and said dielectric layer, said lower dielectric layer abutting a bottom surface of said dielectric layer, a bottom surface of said fuse abutting a top surface of said lower dielectric layer;
forming a first upper damascene wire in an upper dielectric layer, said upper dielectric layer abutting a top surface of said dielectric layer, a first region of a top surface of said fuse abutting a bottom surface of said first upper damascene wire; and
forming a second upper damascene wire in said upper dielectric layer, a second and different region of said top surface of said fuse abutting a bottom surface of said second upper damascene wire.

19. The method of claim 13, further including:
forming an island of trench isolation in a semiconductor substrate, top surfaces of said trench isolation and said semiconductor substrate coplanar and abutting a lower surface of said dielectric layer, a bottom surface of said fuse abutting a top surface of said trench isolation;
forming a first upper damascene wire in an upper dielectric layer, said upper dielectric layer abutting a top surface of said dielectric layer, a first region of a top surface of said fuse abutting a bottom surface of said first upper damascene wire; and
forming a second upper damascene wire in said upper dielectric layer, a second and different region of said top surface of said fuse abutting a bottom surface of said second upper damascene wire.

20. The method of claim 13, further including:
forming a first upper damascene wire in an upper dielectric layer, said upper dielectric layer abutting a top surface of said dielectric layer, a first region of a top surface of said fuse abutting a bottom surface of said first upper damascene wire;
forming a second upper damascene wire in said upper dielectric layer, a second and different region of said top surface of said fuse abutting a bottom surface of said second upper damascene wire; and
wherein a top surface of said fuse is coplanar with said top surface of said dielectric layer and said fuse does not extend completely through said dielectric layer.

21. The method of claim 13, wherein said conformal liner comprises a layer of Co, Ru, Ir, Rh, Pt or Ta.

22. The method of claim 13, wherein said conformal liner comprises a first layer of TaN, TiN, W(N), or RuTa(N) lining the sidewalls and bottom of said trench and a second layer of Co, Ru, Ir, Rh, Pt or Ta on said first layer.

23. The method of claim 13, wherein said dielectric material has a relative permittivity of about 3.0 or less or is a porous dielectric material.

24. The method of claim 13, wherein said second thickness is between about 1 nm and about 5 nm.

25. The method of claim 13, wherein forming said fuse includes:
forming said electrically conductive and conformal liner on a top surface of said dielectric layer;
forming a fill layer of said dielectric material on said top surface of said dielectric layer; and
performing a chemical-mechanical polish to remove said conformal liner layer, said reflowed copper layer and said fill layer from said top surface of said dielectric layer.

26. The method of claim 25, wherein said reflowing is performed a temperature of less than about 400° C. in a reducing atmosphere.

27. The method of claim 13 wherein said copper layer is a conformal copper layer having a same thickness over said sidewalls and over said bottom of said trench.

28. A fuse circuit, comprising:
a fuse switchably connected between a positive voltage source and ground, said fuse also switchably connected between said positive voltage source and a compare circuit configured to output the state of said fuse; and
said fuse comprising:
a trench formed in a dielectric layer;
an electrically conductive and conformal liner on sidewalls and the bottom of said trench;
a copper layer on said conformal liner, a first thickness of said copper layer over said bottom of said trench in a lower portion of said trench greater than a second thickness of said copper layer over said sidewalls of said trench in an abutting upper portion of said trench; and
a dielectric material on said copper layer in said trench, said dielectric material only in said trench and filling remaining space in said upper portion of said trench.

* * * * *